United States Patent [19]
Takayanagi et al.

[11] Patent Number: 5,128,214
[45] Date of Patent: Jul. 7, 1992

[54] AMORPHOUS PURE IRON FILM

[75] Inventors: Noboru Takayanagi, Toyota; Kazuhiro Akihama; Yoshimi Kizaki, both of Nagoya, all of Japan

[73] Assignees: Toyota Jidosha Kabushiki Kaisha, Toyota; Kabushiki Kaisha Toyota Chuo Kenkyusho, Aichi, both of Japan

[21] Appl. No.: 565,063

[22] Filed: Aug. 10, 1990

[30] Foreign Application Priority Data

Aug. 22, 1989 [JP] Japan ................................ 1-215420
Jan. 25, 1990 [JP] Japan ................................ 2-16796

[51] Int. Cl.$^5$ ............................................. C23C 14/14
[52] U.S. Cl. .................................. 428/681; 428/433; 428/936; 148/403
[58] Field of Search ............... 428/593, 630, 665, 681, 428/433; 420/8, 430; 148/403

[56] References Cited

U.S. PATENT DOCUMENTS

| | | | |
|---|---|---|---|
| 4,469,536 | 9/1984 | Forester | 148/403 |
| 4,634,306 | 1/1987 | Dzuir | 148/403 |
| 4,851,296 | 7/1989 | Tenhover et al. | 428/681 |

FOREIGN PATENT DOCUMENTS

| | | | |
|---|---|---|---|
| 132907 | 2/1985 | European Pat. Off. | 148/403 |
| 134653 | 3/1985 | European Pat. Off. | 148/403 |
| 51919 | 4/1979 | Japan | 148/403 |

OTHER PUBLICATIONS

Applied Physics A 47, Nov. 1988, Formation of Dielectric and Semiconductor Thin Films by Laser-Assisted Evaporation, H. Sankur & J. Cheung.

Primary Examiner—George Wyszomerski
Attorney, Agent, or Firm—Oblon, Spivak, McClelland, Maier & Neustadt

[57] ABSTRACT

A metal target and a substrate are disposed in confronting relationship in a vacuum chamber whose interior is kept at high vacuum, and laser light is irradiated to the surface of the target to emit a high-speed evaporated material from the target. The high-speed evaporated material is then deposited on the substrate. By applying a predetermined voltage between the target and the substrate, the impact energy of the charged particles in the evaporated material on the substrate are controlled to form an amorphous metal film preferably a pure iron film.

4 Claims, 5 Drawing Sheets

FIG. 3A

X-RAY DIFFRACTION INTENSITY (ARBITRARY UNIT)

APPLIED VOLTAGE = 1 KV    ×50

X-RAY DIFFRACTION INTENSITY (ARBITRARY UNIT)

APPLIED VOLTAGE = 0 KV    ×1

X-RAY DIFFRACTION INTENSITY (ARBITRARY UNIT)

APPLIED VOLTAGE = −1 KV    ×50

2θ

AMORPHOUS PURE IRON FILM

BACKGROUND OF THE INVENTION

1. Field of the Invention:

This invention relates to an amorphous metal film, and a method and apparatus for production thereof.

2. Description of the Related Art:

Amorphous materials are not entirely crystalline and have only short-range order in its structure, having characteristics good in corrosion resistance, wear resistance, etc.

Further, amorphous iron or iron alloy has a good magnetic characteristic, such as a high magnetic permeability and a low coercive force, so that materials suitable for use in various kinds of applied art such as transformers and magnetic heads are provided. Consequently, researches and studies have in recent years been made on amorphous materials.

Heretofore, for forming amorphous materials such as an amorphous film, a vacuum deposition method, a sputtering method and a liquid quenching method are known.

In the vacuum deposition method, a sample is heated and evaporated in a vacuum chamber by, for example, a heater, and is deposited and cooled on a substrate to form an amorphous film.

In the sputtering method, a plasma of argon or nitrogen gas is formed in a vacuum chamber to sputter (strike out) sample particles with the plasma particles so that the sample particles are deposited and cooled on a substrate.

In the liquid quenching method, a sample is melted by heating at a temperature higher than its melting point, and the melted sample is then cooled quickly.

However, according to the liquid quenching method, there is a limit in the cooling rate (maximum speed of about $10^7$ K/sec), and hence only limited kinds of metals or alloys can be made amorphous.

According to the vacuum deposition method, since the energy of the sample particles during deposition is relatively low, the cooling rate of the sample particles deposited on the substrate is small so that only limited kinds of metals or alloys can be made amorphous.

According to the sputtering method, the cooling rate of the sample particles on the substrate is higher than that in the vacuum deposition method, but argon gas in the atmosphere will be mixed into a prospective film during sputtering, thus deteriorating the film quality. Therefore it is difficult to form a good quality amorphous film. Forming a single-metal or alloy amorphous film requires a high cooling rate of, for example, higher than $10^{10}$K/sec for Ni (nickel) [Publication by H. A. Davies: proc. of 3rd intern. conf. on Rapidly Quenched Metals (1978) 1]. For this reason, according to the conventional methods, such good quality amorphous film could not be achieved.

SUMMARY OF THE INVENTION

It is therefore an object of this invention to provide a single-metal or alloy amorphous film and a method of production thereof.

According to a first aspect of the invention, an amorphous metal film formed on a surface of a substrate by deposition, wherein the metal film has a noncrystalline structure such that the result of X-ray diffraction shows a broad pattern, the metal film comprising a metal having a critical cooling rate of higher than $10^7$K/sec. The amorphous metal film comprises a single metal or an alloy and includes a noncrystalline state composed of a noncrystalline film and a partial crystal structure.

According to a second aspect of the invention, there is provided a method of producing an amorphous metal film, comprising: placing an alloy or single-metal target and a substrate in a vacuum chamber whose interior is kept in a high vacuum state; irradiating laser light to a surface of the target to evaporate a high-speed evaporated material from the target; applying an electric field between the target and the substrate, depending on a critical cooling rate needed for making the evaporated material on the substrate amorphous and depending on impact energy of the high-speed evaporated material against the substrate; and cooling the evaporated material on the substrate at the critical cooling rate and accelerating a charged component in the evaporated material to increase the impact energy against the substrate so that agitation occurs in atom arrangement of the film to form a noncrystalline metal film on the substrate.

According to a third aspect of the invention, there is provided an apparatus for producing an amorphous metal film on a substrate, comprising: a vacuum chamber whose interior is kept in a high vacuum state; a target holder disposed in the vacuum chamber for holding an alloy or a single-metal target; a substrate holder disposed in the vacuum chamber in confronting relation to the target holder for holding the substrate; a laser irradiating means for irradiating laser light to a surface of the target, which is held by the target holder, to generate a high-speed evaporated material; and a voltage applying means for applying an electric field between the target and the substrate for maintaining a critical cooling rate needed to make the evaporated material on the substrate amorphous and also maintaining impact energy of the high-speed evaporated material against the substrate.

Since the laser is capable of concentrating energy on the target at high density, the emitting velocity of the evaporated material is greater than in the conventional art and the temperature (energy) of the evaporated material is higher than in the conventional art. Therefore it is possible to increase the cooling rate (from the temperature of the evaporated material to room temperature) of the evaporated material on the substrate. Further, since the evaporated material can be formed in high vacuum, it is possible to prevent impurities from mixing in the film.

If the evaporated material contains positively or negatively charged particles, the application of electric field can increase the energy of the charged component of the evaporated material and increase the cooling rate of the charged component, and can break the chemical bond in the deposited film and implant the high-energy evaporated material thereinto to agitate the atom arrangement of the film, thus easily making the film structure amorphous. Accordingly, an amorphous film of a single metal or alloy requiring a high cooling rate, for example, an amorphous magnetic film such as of Fe (iron) having a good magnetic characteristic can be produced.

As discussed above, by utilizing laser light, it is possible to obtain an amorphous single-metal or alloy film.

The amorphous metal or alloy film, for example, an amorphous iron film is excellently resistant to corrosion and wear and has a good magnetic characteristic, such as high magnetic flux density, high magnetic permeability and low coercive force, so that materials suitable for use in various kinds of applied art such as transformers and magnetic heads.

As described above, according to this invention, partly since laser light is irradiated to the target in a vacuum chamber to evaporate a part of the target to deposit the evaporated material on the substrate, and partly since a predetermined electric field is applied between the target and substrate, depending on the critical cooling rate of the evaporated material, it is possible to increase the energy of the charged component in the evaporated material, to increase the cooling rate of the evaporated material, to break the chemical bond in the deposited film, to implant the high-energy evaporated material into the film to agitate the atom arrangement of the film, thus obtaining an excellent quality amorphous metal or alloy film.

The above and other advantages, features and additional objects of this invention will be manifest to those versed in the art upon making reference to the following detailed description and the accompanying drawings in which certain preferred embodiments incorporating the principles of this invention are shown by way of illustrative example.

BRIEF DESCRIPTION OF THE DRAWINGS

FIG. 3, (A), (B) and (C), are pattern diagrams showing the result of X-ray diffraction of a sample amorphous pure iron film;

DETAILED DESCRIPTION

Figure 1:
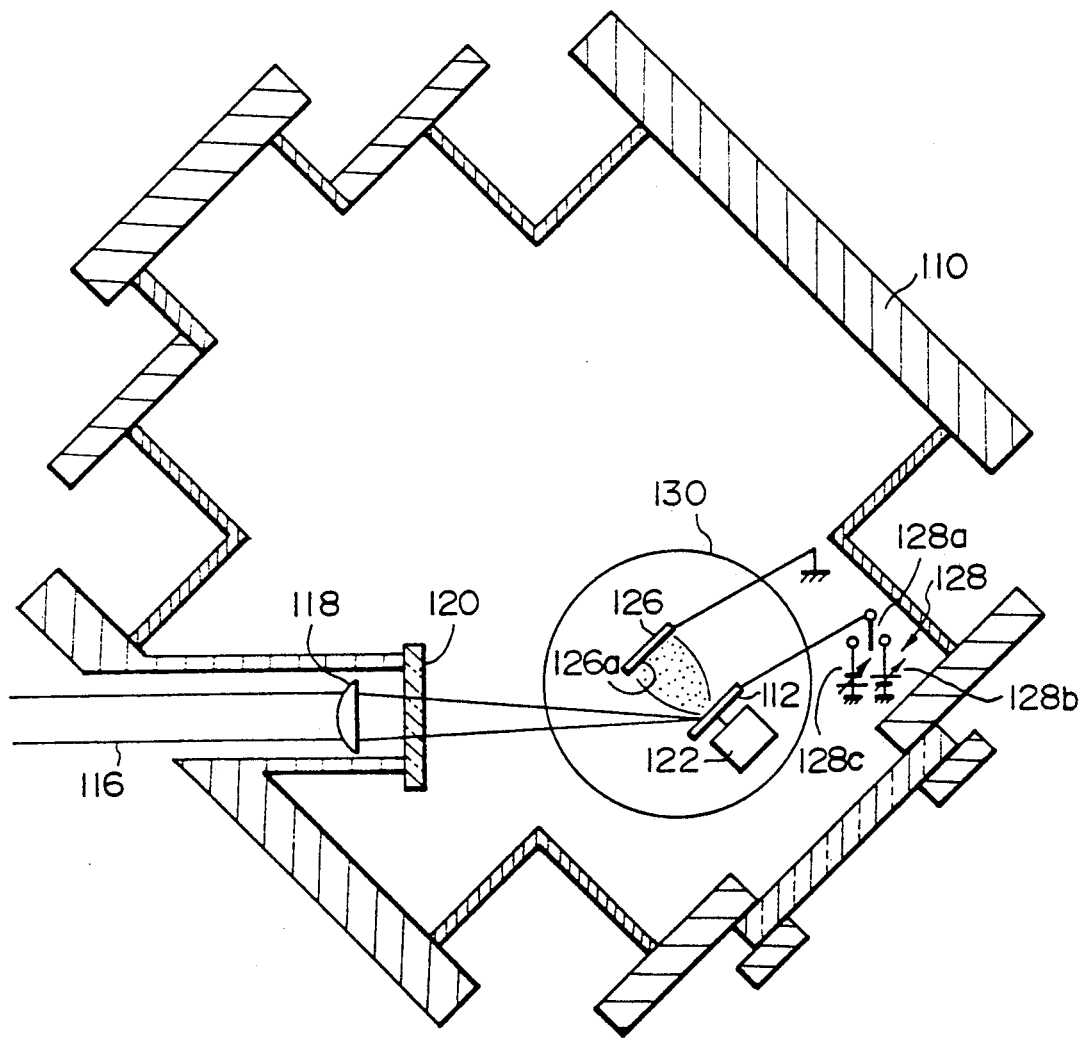
FIGS. 1 and 2 show an amorphous metal film producing apparatus embodying this invention.
Figure 2:
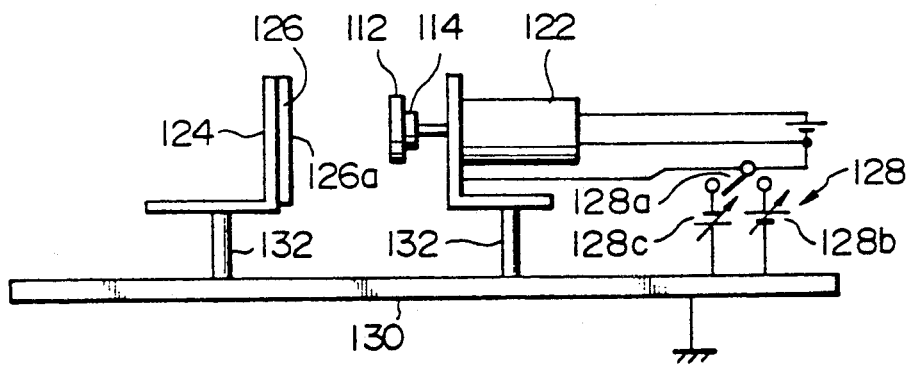

FIGS. 1 and 2 show an amorphous metal film producing apparatus.

As shown in FIGS. 1 and 2, a vacuum chamber 110 is vacuumed at its interior by a non-illustrated pump. Inside the vacuum chamber 110, a target 112 for material of an amorphous film is mounted on a target holder 114, and laser light 116 from a non-illustrated laser light generator means is irradiated to the target 112 via a condenser lens 118 and a transmitting window 120. The target 112 is rotated at a constant speed by a d.c. motor 122 so that the target 112 is prevented from point damage due to focus of the laser light 116.

A substrate holder 124 is disposed in confronting relation to the target 112 with a predetermined distance therebetween. A substrate 126, on which particles evaporated from the target 112 are deposited to form a film 126a as described below, is mounted on the substrate holder 124. In the illustrated embodiment, glass is used for the substrate 126.

The substrate holder 124 is connected to the ground and the target holder 114 is connected to a d.c. power supply 128, giving a desired potential difference between the target 112 and the substrate 126. The d.c. power supply 128 is composed of a switch 128a, a positive variable power supply 128b and a negative variable power supply 128c, keeping the target 112 at a desired potential.

This application of potential is performed on a single metal or alloy, such as of Fe or Ni, which requires a high cooling rate. The application of potential can increase the energy of the charged component in the evaporated material to increase the cooling rate of the evaporated material, can break the chemical bond in the deposited film 126a, can implant the high-energy evaporated material into the film to agitate the atom arrangement of the film 126a, thus making the film structure amorphous. At that time, if a positive potential is applied, the positively charged particles in the emitted material will be repelled, and the negatively charged particles will be accelerated. Reversely, if a negative potential is applied, the positively charged particles of the emitted material will be accelerated, and the negatively charged particles will be repelled.

Therefore, by applying the positive or negative potential, it is possible to increase the energy of the evaporated material, increase the cooling rate, breaking the chemical bond in the deposited film 126a and implant the high-energy evaporated material into the film 126a, thus making the film structure amorphous.

The substrate holder 124 and the target holder 114 are supported on a positioning rotary stage 130 via an insulator 132.

EXPERIMENT 1

To form an amorphous pure iron film, pure iron was mounted on the target holder 114, and then the interior of the vacuum chamber 110 was vacuumed at lower than $1 \times 10^{-5}$ Torr.

Then, using KrF excimer laser, which can produce a high outimplant (wavelength of 249 nm, pulse width of 16 nsec, pulse frequency of 25 pulses/sec and pulse energy of 250 mJ), laser light 116 was irradiated to the target 112 of pure iron (99.999% purity) for 20 minutes while the target 112 was rotating at 20 rpm. The angle of irradiation of laser light with respect to the normal of the surface of the target holder 114 was about 45°, and the area of the laser light 116 irradiated on the pure-iron target 112 was about $6 \times 10^{-3} cm^2$.

Subsequently, a predetermined potential is applied to the target holder 114 by the d.c. power supply 128. As a result, an amorphous pure-iron film 126a was formed on the glass substrate 126.

FIG. 3 (A), (B) and (C), shows the results of X-ray diffraction of the amorphous pure-iron film 126a when the applied voltage was 1 kV, 0 kV and $-1$ kV. The longitudinal axis in FIGS. 3a and 3c is fifty times longer than that in FIG. 3b. A Co $k\alpha$-ray was used for X-ray diffraction.

In FIG. 3, the horizontal coordinate represents the diffraction angle, and the vertical coordinate represents the diffraction intensity of X-ray. The X-ray diffraction pattern of the applied voltage 0 kV shows a crystal structure having a peak 34 on the (110) plane. However, with the films 126a when the applied voltage was 1 kV and $-1$ kV, their X-ray diffraction patterns were broad patterns each not having remarkable peaks, showing a noncrystalline structure.

Thus, because the high-energy evaporated material is forced into the film by application of electric field, it is possible to form an amorphous pure-iron film.

Figure 4:
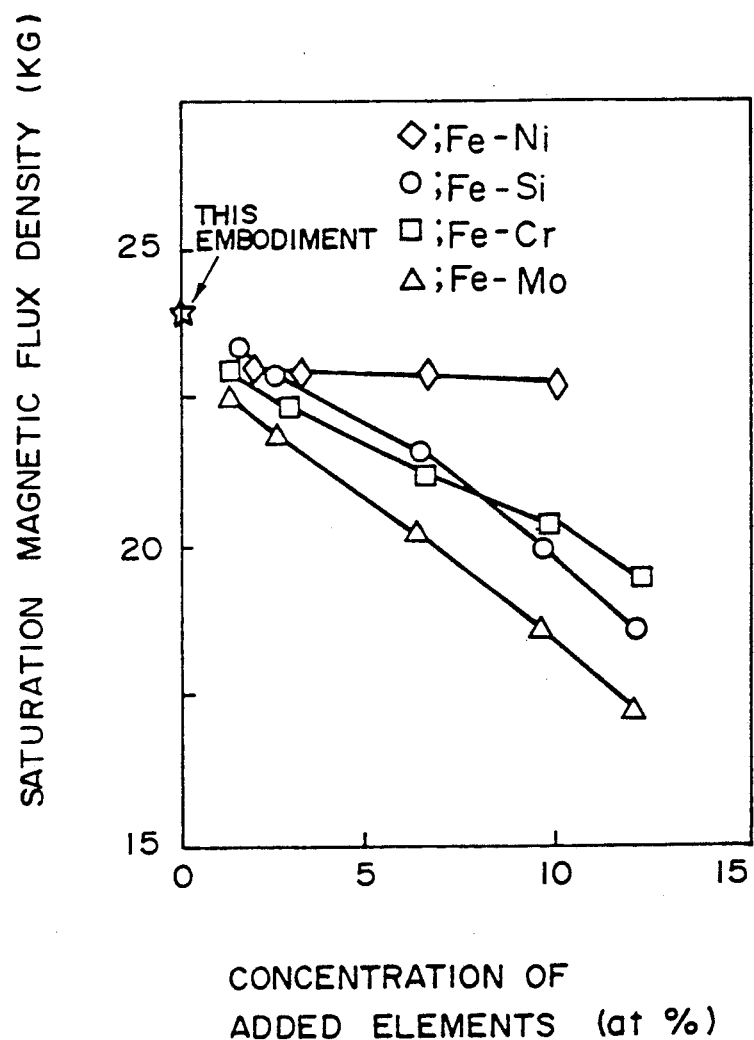
FIG. 4 is a characteristic diagram showing saturation magnetic flux densities of sample amorphous pure iron film and iron alloy film.

FIG. 4 shows the change of saturation magnetic flux densities when other metal elements were individually added to pure iron. According to the amorphous pure-iron film of this example, the saturation magnetic flux density was 24 kG, which was relatively large, compared to that with the case where another element such as Ni, Si, Cr or Mo was added to pure iron.

Accordingly, with the amorphous pure-iron film of this embodiment, it is possible to realize a high magnetic flux density, compared to the conventional alloy film. This amorphous pure-iron film is particularly suitable for various kinds of parts or devices such as transformers and magnetic heads.

EXPERIMENT 2

To form an amorphous tungsten (hereinafter called "W") film, pure W was mounted on the target holder 114, and then the interior of the vacuum chamber 110 was vacuumed at lower than $1 \times 10^{-5}$ Torr.

Then, using KrF excimer laser, which can produce a high outimplant (wavelength of 249 nm, pulse width of 16 nsec, pulse frequency of 25 pulses/sec and pulse energy of 250 mJ), laser light 116 was irradiated to the target 112 of pure tungsten (99.999% purity) for 20 minutes while the target 112 was rotating at 20 rpm. The angle of irradiation of laser light with respect to the normal of the surface of the target holder 114 was about 45°, and the area of the laser light 116 irradiated on the pure-W target 112 was about $6 \times 10^{-3} cm^2$.

Subsequently, a predetermined potential is applied to the target holder 114 by the d.c. power supply 128. As a result, an amorphous pure-W film 126a was formed on the glass substrate 126.

Figure 5:
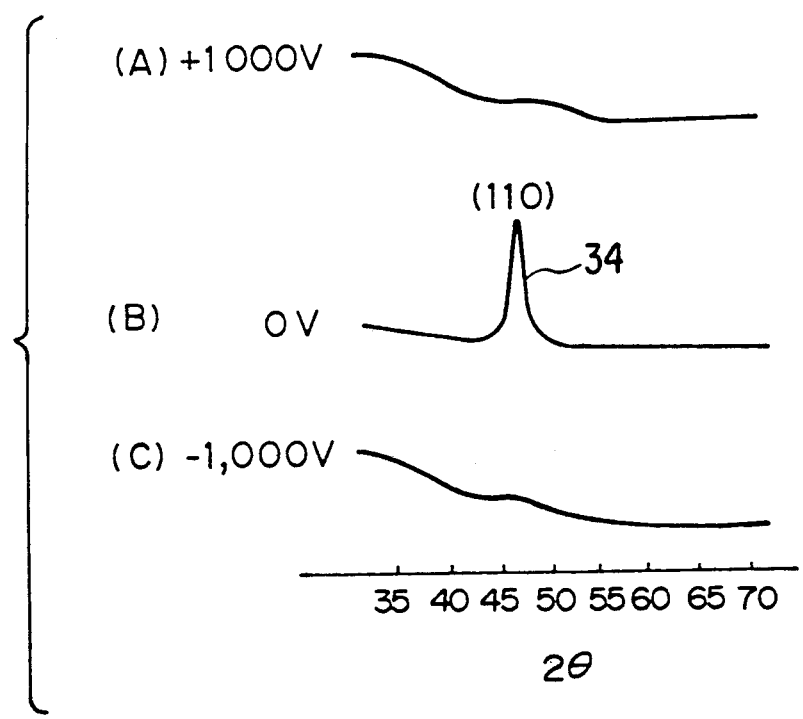
FIG. 5 is a pattern diagram showing the result of X-ray diffraction of a sample amorphous tungsten film.

FIG. 5 (A), (B) and (C), shows the results of X-ray diffraction of the amorphous pure-W film 126a when the applied voltage was 1 kV, 0 kV and −1 kV.

In FIG. 5, the horizontal coordinate represents the diffraction angle, and the vertical coordinate represents the diffraction intensity of X-ray. The X-ray diffraction pattern of the applied voltage 0 kV shows a crystal structure having a peak 34 on the (110) plane. However, with the films 126a when the applied voltage was 1 kV and −1 kV, their X-ray diffraction patterns were broad patterns each not having remarkable peaks, showing a noncrystalline structure.

Thus, because the high-energy evaporated material is forced into the film by application of electric field, it is possible to form an amorphous pure-W film.

According to this invention, it is possible to form an amorphous film of pure iron and pure W as well as another metal or alloy having a critical cooling rate lower than that of pure iron.

What is claimed is:

1. An amorphous metal film formed on a surface of a substrate by deposition, wherein said metal film is a pure iron film.

2. An amorphous metal film formed on a surface of a substrate by a process of deposition comprising the steps of:
   placing a pure iron target and a substrate in a vacuum chamber whose interior is kept in a high-vacuum state;
   irradiating pulsed laser light to a surface of the target to evaporate a high-speed evaporated material from the target; and
   applying an electric field between the target and the substrate to form a noncrystalline metal film on the substrate, said electric field resulting from a voltage having an absolute value of greater than 1 kv.

3. A film according to claim 2, wherein the interior of the vacuum chamber is kept at less than $1 \times 100^{-5}$ Torr.

4. An amorphous metal film according to claim 2, wherein said metal film is a pure iron film.

* * * * *

UNITED STATES PATENT AND TRADEMARK OFFICE
CERTIFICATE OF CORRECTION

PATENT NO. : 5,128,214

DATED : July 7, 1992

INVENTOR(S) : NOBORU TAKAYANAGI ET AL

It is certified that error appears in the above-identified patent and that said Letters Patent is hereby corrected as shown below:

Col. 6,
in claim 3, line 2, change "$1 \times 100^{-5}$ Torr" to --$1 \times 10^{-5}$ Torr--.

Signed and Sealed this

Fifth Day of October, 1993

Attest:

BRUCE LEHMAN

Attesting Officer

Commissioner of Patents and Trademarks